United States Patent [19]

Ishino et al.

[11] Patent Number: 5,205,145
[45] Date of Patent: Apr. 27, 1993

[54] METHOD OF PRODUCING TORQUE SENSOR SHAFTS

[75] Inventors: Renshiro Ishino; Yoshio Shibata, both of Hirakata, Japan

[73] Assignee: Kubota Corporation, Osaka, Japan

[21] Appl. No.: 876,520

[22] Filed: Apr. 30, 1992

[30] Foreign Application Priority Data

Sep. 25, 1989 [JP] Japan .................................. 1-249821

[51] Int. Cl.$^5$ .......................... B21D 31/06; H01L 41/12
[52] U.S. Cl. .......................................... 72/53; 310/26; 29/90.7; 51/320
[58] Field of Search ............... 72/53; 73/660, DIG. 2, 73/862.36; 310/26; 29/90.7; 51/320

[56] References Cited

U.S. PATENT DOCUMENTS

3,073,022  1/1963  Bush et al. ................................ 72/53
4,933,580  6/1990  Ishino et al. ........................... 310/26

Primary Examiner—David Jones
Attorney, Agent, or Firm—Joseph W. Farley

[57] ABSTRACT

The invention relates to a method of producing magnetostriction type torque sensor shafts adapted to detect a change in permeability when a torque is applied. A plurality of shot peening operations are applied to the surface of a torque sensor shaft in such a manner that the diameter of shot particles to be used is decreased each time. This arrangement ensures that the region in which the residual stress is at a maximum and approximately constant lies over a wide range as seen in the direction of the depth from the outermost surface of the shaft and extends from a deep area to an area close to the surface of the shaft. As a result, the hysteresis and nonlinearity of the shaft are improved and it becomes possible to use a wide range of excitation frequencies.

6 Claims, 5 Drawing Sheets

METHOD OF PRODUCING TORQUE SENSOR SHAFTS

This is a continuation-in-part of copending application Ser. No. 07/806,840 filed on Dec. 9, 1991 and now abandoned, which is a continuation of application Ser. No. 07/586,423 filed on Sep. 21, 1990 and now abandoned.

FIELD OF THE INVENTION

The present invention relates to a method of producing torque sensor shafts and more particularly it relates to a method of producing magnetostriction type torque sensor shafts adapted to detect changes in permeability particularly during torque application.

BACKGROUND OF THE INVENTION

Magnetostriction type torque sensor shafts have been known, as one is shown in Japanese Patent No. 169,326, wherein the surface of a sensor shaft adapted to have torque transmitted thereto is formed with a magnetically anisotropic section by forming spiral grooves therein by cutting or rolling so as to detect changes in the permeability of the magnetic anisotropic section, when torque is applied, to expess them in terms of electrical quantities.

Hitherto, however, no torque sensor of such grooved type has been put in actual use in the art. The reason for this is that a torque sensor shaft constructed of a structural steel material through a mere process such that the material is formed with spiral grooves and then subjected to suitable heat treatment is liable to hysteresis, usually of the order of about 2 to 20% FS, and could not be used as such in any practical application. Recently, in order to put the basic principle of such torque sensor shaft into practical use, a knurled type magnetostrictive torque sensor has been proposed as disclosed in U.S. Pat. No. 4,933,580 of the present inventors, wherein shot peening is applied to the grooved portion to decrease hysteresis and improve sensitivity.

The achievement of hysteresis reduction through the process of peening the grooved portion after heat treatment as described in U.S. Pat. No. 4,933,580 is explained by the fact that broadly peening has two kinds of effect, mechanical and magnetic.

More specifically, the mechanical effect of shot peening includes the effect of mending microcracks produced during the process of groove forming, and the effect of improving the mechanical strength. The improvement of the mechanical strength is brought about in the form of hardened surface layer of the shaft and reduced crystal grain size of the surface layer which result from the collision of small shot particles blown. Such mechanical effect results in reduced hysteresis of the sensor.

The magnetic effect of shot peening includes improvement in the process of surface magnetization and intensification of the magnetic anisotropy of the sensor. The improvement of surface magnetization occurs as a result of the fact that by virtue of shot peening the process of surface magnetization changes from magnetization through domain wall displacement, a process which tends to cause magnetic hysteresis, to revolving magnetization, a process which is unlikely to cause magnetic hysteresis. Such improvement in the process of magnetization results in reduced hysteresis and improved sensor sensitivity. The intensification of the magnetic anisotropy results from the fact that shot peening induces development of residual stress on the shaft material as will be described hereinafter. By virtue of the intensified magnetic anisotropy the non-linearity of the sensor is corrected.

In the past, the effect of shot peening was well known in that the hardness of the outermost surface layer of the shaft was increased and some compressive residual stress was provided, which would result in improved mechanical strength (fatigue strength). However, the past recognition in the art that the effect of shot peening was limited to the improvement of such mechanical strength involves the following inconsistency. While, as is well known, shot peening brings about increased hardness of the surface layer of the material and, in conjunction therewith, improved surface layer strength of the material, it must be pointed out that the magnetic hardness of the material is also increased and accordingly the retentivity of the material becomes so large that the material can hardly be magnetized further. As a matter of practice, therefore, mere improvement in mechanical strength is generally likely to lead to decreased sensitivity.

According to experiments conducted by the present inventors, wherein a shaft material was hardened by carburizing, tempered and heat treated to thereby increase the hardness of its surface layer, while for the purpose of comparison a similar shaft material was hardened in a carburization-prevented condition, and then tempered and heat treated, that is, bright-hardened, tempered and heat treated without so much increase in the hardness of the shaft surface, the higher the shaft hardness resulting from carburization, the lower was the sensitivity of the torque sensor using the shaft.

As is apparent from this, the effect of shot peening presents some aspect that cannot be explained only on the basis of increased mechanical hardness and/or increased mechanical strength; and improvements in all sensor characteristics, such as reduced hysteresis, reduced non-liniarity, and improved sensitivity, can be obtained as an overall effect of shot peening, or a combination of mechanical effect and magnetic effect as above stated. In the earlier known shot peening technique as disclosed in, for example, U.S. Pat. No. 3,073,022, the effect of shot peening for mechanical strength improvement, as intended mainly for improvement of fatigue strength, was only taught. In the prior art, the above cited U.S. Pat. No. 4,933,580 was the first disclosure which referred to the above stated magnetic effect.

More particularly, in the invention of a magnetostrictive torque sensor described in U.S. Pat. No. 4,933,580, shot peening is applied to the grooved portion of a sensor shaft and to areas therearound thereby to mechanically, metallurgically and magnetically improve the outermost surface layer of the grooved portion to reduce hysteresis and increase sensitivity. That is, the following techniques are disclosed therein.

(1) Improvement of Mechanical and Metallurgical Strength of Grooves and Areas therearound:

Application of shot peening to grooves and areas therearound martensitizes the residual austenite in the outermost surface layer produced during carburization to shafts to thereby increase hardness and it decreases crystal grain size, whereby the strength of the outermost surface layer through which magnetic flux passes is increased to a great extent.

As a result, when torque is applied, sufficient strength is provided to resist the stress concentrated in the grooves. Even if a large stress is applied, there is little possibility of producing a macroscopic mechanical plastic deformation or a plastic deformation on the microscopic crystalline level which causes the first mentioned plastic deformation or, in other words, a magnetic plastic deformation. As a result, the hysteresis characteristic is improved.

An auxiliary effect obtained is that the sensitivity is increased owing to the nonmagnetic residual austenite being converted to ferromagnetic martensite.

(2) Effect of Mending Microcracks in Grooves and Areas therearound:

Generally, microcracks are often produced in grooves and areas therearound during machining, particularly rolling.

Such microcracks aggravate the hysteresis characteristic and lower the sensitivity of sensors.

As is well known, shot peening has the effect of mending such microcracks and hence it is useful for improving the hysteresis characteristic and increasing the sensor sensitivity.

(3) Improvements in Magnetization of Outermost Surface Layers of Sensors:

Usually, magnetostrictive sensors are magnetized in a low magnetic field having a magnetic intensity of tens of oersteds at 10 kHz to 100 kHz. In most cases, the skin depth is about 0.1 mm immediately below the outermost surface layer and the magnetization process is based mostly on the domain wall displacement.

In this case, the presence of impurities and nonmagnetic inclusions in the skin depth region forms a cause of magnetic hysteresis, and since shaft materials in common use cannot avoid these impurities, it has been usual that the hysteresis characteristic is bad.

On the other hand, application of shot peening results in forming microscopic unevenness in the outermost surface layer of the grooves and areas therearound which form the magnetically anisotropic section of the sensor.

According to the teachings of physics of magnetism, formation of microscopic pits on a metal surface by plastic deformation results in formation of stable magnetic domains around the microscopic pits due to annular residual stress, with the magnetization process in the annular stable magnetic domains converting to magnetization rotation with less magnetic hysteresis, thereby lowering the hysteresis characteristic of the sensor.

With the above effects organically coupled together, application of shot peening brings about a decrease in hysteresis and an increase in sensitivity.

The action based on the effect (3) above is based on the action of residual stress distribution applied to a region in the vicinity of the outermost surface layer.

According to the known technique as described in the above cited U.S. Pat. No. 4,933,580, when shot peening is applied to the surface of a sensor shaft, only shot particles of uniform size are used. If the size of shot particles is large, a stress distribution in which the compressive residual stress is at a maximum and approximately constant is formed in a deep region below the shaft surface in a wide range as seen in the direction of the depth. Further, if the size of shot particles is small, a peak value of compressive residual stress is obtained in a shallow region, but in this case the region where the compressive residual stress is approximately constant is narrow.

For this reason, in the case where the size of shot particles is small, excitation conditions using high frequency ac currents are utilized to ensure shallow penetration of magnetic flux; in this manner, optimum excitation conditions are provided. However, since the region where the compressive residual stress is approximately constant is narrow, it is necessary that the range of utilizable excitation frequencies be from 50 kHz to 100 kHz, which are considerably high frquencies.

In the case where the size of shot particles is large, excitation conditions using low frequencies (usually, about 10 kHz) to enable magnetic flux to penetrate into depths are selected so that the depth of penetration of magnetic flux is greater than when the size of shot particles is small and so as to minimize the influence on the outermost surface layer of the shaft where the changes in stress distribution is large and where the compressive residual stress is small; in this manner, hysteresis and sensitivity are improved. However, in this case, the region of the shaft near its surface aggravates the sensor characteristics. Therefore, when it is desired to obtain satisfactory hysteresis characteristics, it is necessary to use a large excitation current.

In torque sensor shafts having such conventional shot peening methods applied thereto, the range in which the compressive residual stress is approximately constant does not necessarily have a sufficient expanse, so that there is a problem that the range of usable excitation frequencies is narrow.

DISCLOSURE OF THE INVENTION

The present invention is intended to solve such problems and its object is to enlarge the range in which the compressive residual stress is approximately constant from the outermost surface layer toward the shaft center to thereby enlarge the optimum excitation frequency range.

To achieve this object, in accordance with the invention, a method of producing torque sensor shafts of magnetostrictive type adapted to detect changes in permeability when torque is applied, is characterized in that a plurality of shot peening operations are applied to the surface of a torque sensor shaft material including at least a magnetostrictive portion by successively using shot particles of different diameters, from larger to smaller, whereby a torque sensor shaft having improved mechanical characteristics and, in particular, improved magnetic characteristics is obtained which is suitable for use in making a magnetostriction type torque sensor having improved performance characteristics in respect of hysteresis, sensitivity, and non-lininearity in particular, based on stress and magnetic characteristics of the sensor, when the torque sensor shaft is used in making the torque sensor.

With this scheme, first with shot particles of large diameter, a distribution in which the compressive residual stress is at a maximum and constant is obtained in a deep region below the shaft surface. Subsequently, by successively applying shot peening operations using shot particles of successively smaller diameters, the region in which the compressive residual stress is at a maximum and approximately constant is progressively enlarged toward a shallower region below the outermost surface layer of the shaft. Therefore, finally, the region in which the compressive residual stress is at a maximum and approximately constant lies over a wide range as seen in the direction of the depth. As a result, a reduction in hysteresis and an increase in sensitivity are attained and, as shown in the following embodiments, the nonlinearity can be improved and it becomes possible to use a wide range of excitation conditions.

The relation of the present invention to above cited U.S. Pat. No. 4,933,580 and also to above cited U.S. Pat. No. 3,073,022 will be explained below. The present invention is an improvement on the invention of U.S. Pat. No. 4,933,580. According to the invention of U.S. Pat. No. 4,933,580, the hysteresis level which was as high as 2 to 20% FS in the case of no shot peening being effected can be improved to a level of not more than 1% FS. In contrast to this, the present invention provides for further improvement in hysteresis and, in addition, for good improvement in sensitivity and nonlinearity; thus, sensor characteristics can be remarkably improved.

In the description to follow, the process of shot peening in which one kind of shot particles with single particle size is used is referred to as "single peening", and the process of shot peening in which two kinds of shot particles different in particle size is referred to as "double peening".

Referring to the aspect of mechanical strength improvement, it is already known that improvement in mechanical strength is obtained in the case where single peening is effected. It is also known from the teaching of U.S. Pat. No. 4,933,580 that shot peening results in a decrease in the hysteresis of a torque sensor. Again, it is already known from the teaching of U.S. Pat. No. 3,073,022 that where double peening is effected, greater improvement in mechanical strength can be obtained as compared with the case of single peening being effected. It may possibly be inferred from a combination of teachings of U.S. Pat. No. 4,933,580 and U.S. Pat. No. 3,073,022 that double peening would bring about greater improvement in hystersis characteristic than single peening, but nothing can be inferred for the aspect of sensor sensitivity and nonlinearity improvement.

Referring to the aspect of magnetic characteristic improvement, it is already known that where single peening is applied, the hysteresis of torque sensors is reduced and sensor sensitivity is improved. In U.S. Pat. No. 3,073,022, however, no teaching is given with regard to improvement in magnetic characteristic by double peening. It has for the first time been disclosed by the present invention that double peening can bring about further improvement in magnetic characteristic and can amazingly improve sensor characteristics. Nonlinearity in particular cannot be improved unless improvement in magnetic characteristic is achieved.

The effect of shot peening for magnetic characteristic improvement will be explained in detail hereinbelow.

The effect of improved magnetization for hysteresis reduction is first described in detail, although it has already been briefly referred to. When shot peening is applied, an annular compressive residual stress will develop around shot depressions. This annular region of compressive residual stress acts as a magnetic domain, and the process of its magnetization is such that a rotating magnetization process is predominant wherein magnetic rotation occurs in the direction of an acting stress when the stress is applied. Generally, the process of domain wall displacement is non-reversible and is likely to cause magnetic hysteresis, whereas the process of rotating magnetization is reversible and is unlikely to cause magnetic hysteresis. As a result of shot peening, the magnetizing process in which a non-reversible process of domain wall displacement has been predominant changes into a reversible process of rotating magnetization, and this leads to improvement in the hysteresis characteristic.

Nextly, the effect of sensitivity improvement through improvement of the magnetizing process will be explained. The entire process of magnetization (M) consists of the magnetizing process of domain wall displacement (MW) and the magnetizing process of rotating magnetization (MR). The magnetizing process of domain wall displacement (MW) is divided into a 90° domain wall displacement process (MW 90) and a 180° domain wall displacement process (MW 180). This may be expressed by the following equations:

$$M = MW + MR$$

$$M = MW90 + MR180 + MR$$

The magnitude of the entire magnetizing process (M) is proportional to the permeability or a voltage detected when no torque is applied. It is the 90° domain wall displacement process (MW 90) and rotating magnetization process (MR) that relates to magnetostriction characteristics which influence the sensitivity characteristic. In the present invention, a greater part of the magnetizing process of domain wall displacement (MW 90, MW 180) changes into the rotating magnetization process (MR) because of the annular compressive residual stress due to shot peening and, therefore, the proportion of the magnetizing process which influences the sensitivity characteristic is increased, so that sensitivity improvement can be obtained.

Further, according to the invention, improvement in nonlinearity is obtained through the improvement in the magnetizing process, which will be explained on the basis of the following description of the embodiment.

DESCRIPTION OF EMBODIMENTS

Figure 1:
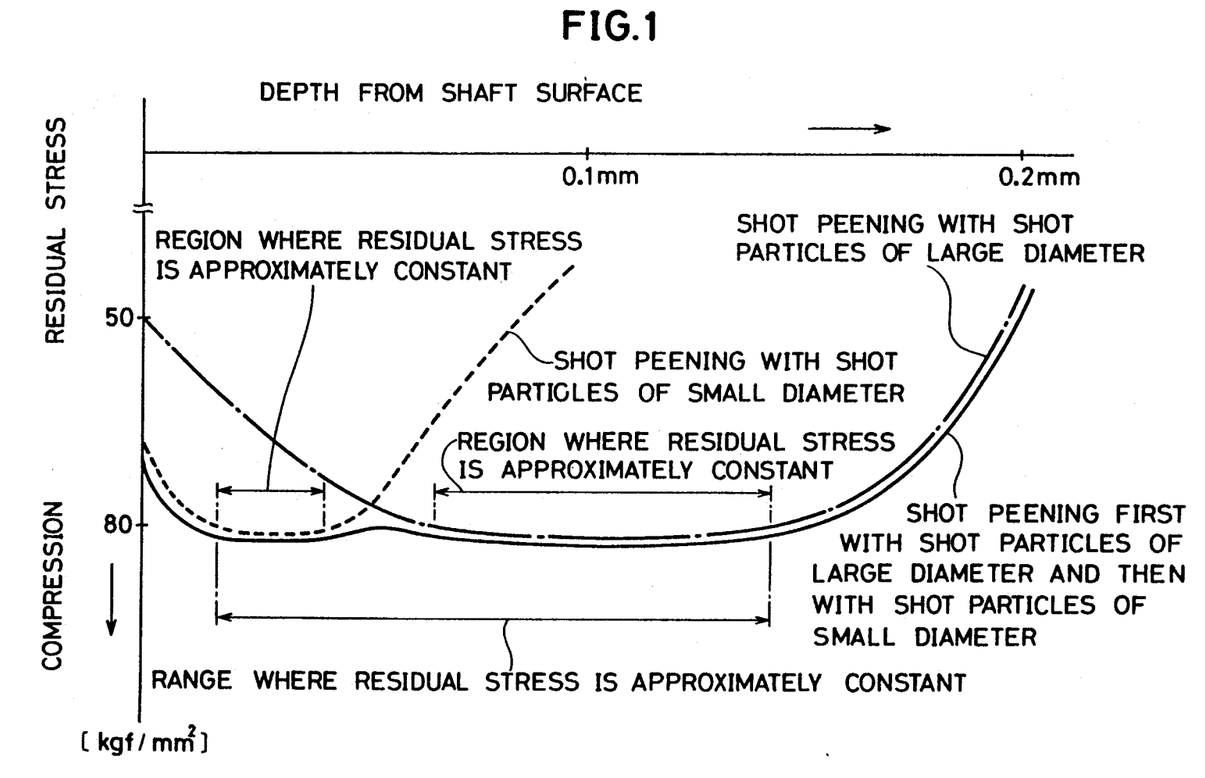
FIG. 1 is a diagram showing a distribution of residual stress in the interior of a torque sensor shaft according to an embodiment of the invention.

FIG. 1 shows a distribution of compressive residual stress in the interior of a shaft when the surface of the material (structural steel SNCM 815, specified in JIS (Japanese Industrial Standard)) of the shaft is subjected to shot peening first with shot particles of large diameter (0.6 mm) and then with shot particles of small diameter (44 μm). The vertical axis represents the magnitude of the compressive residual stress and the horizontal axis represents the depth measured from the shaft surface. In the diagram, the dash-dot line indicates a compressive residual distribution obtained by effecting shot peening with shot particles of large diameter (0.6 mm) alone and the broken line indicates a compressive residual stress distribution obtained by effecting shot peening with shot particles of small diameter (44 μm) alone. The solid line indicates a stress distribution obtained by effecting shot peening first with shot particles of large diameter (0.6 mm) and then with shot particles of small diameter (44 μm).

As previously described, in the case where shot peening is effected with shot particles of large diameter (0.6 mm) alone, an area where the compressive residual stress is at a maximum and approximately constant appears in a deep region from the shaft surface in a wide range (from 0.05 mm to about 0.15 mm) as seen in the direction of the depth. In the case where shot peening is effected with shot particles of small diameter (44 μnm), an area where the compressive residual stress is at a maximum and approximately constant appears in a shallow region from the shaft surface in a narrow range (from about 0 to 0.05 mm).

In the case where shot peening is effected first with shot particles of large diameter (0.6 mm) and then with shot particles of small diameter (44 μm), the range in which the compressive residual stress is at a maximum and approximately constant is wide (from about 0 to 0.15 mm in the direction of depth), extending close to the shaft surface. Therefore, as compared with the case of using shot particles of one fixed diameter alone, it becomes possible to use a wide range of excitation conditions to enlarge the range of use of torque sensors.

Figure 2:
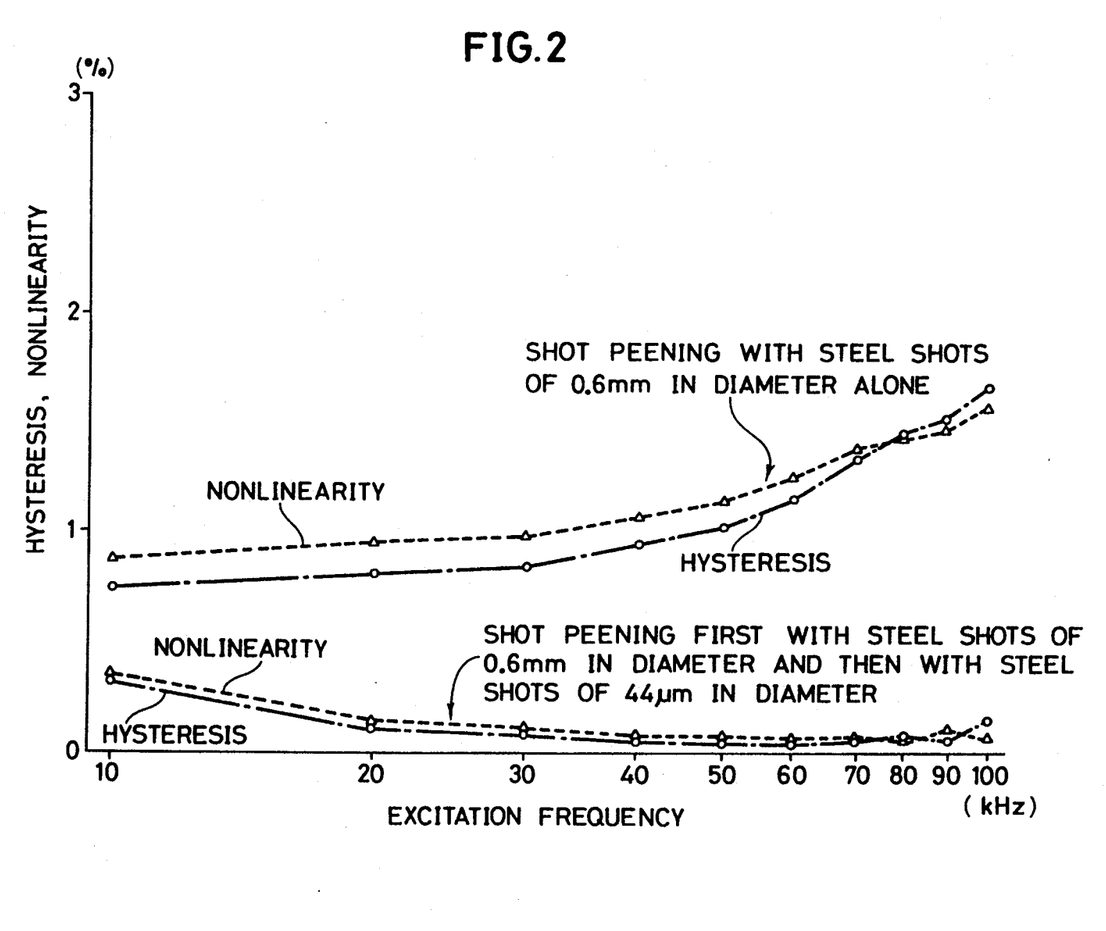
FIG. 2 is a diagram showing frequency characteristics versus hysteresis and nonlinearity for a torque sensor using a torque sensor shaft representing an embodiment of the invention.

FIG. 2 shows an example of frequency characteristic versus hysteresis and nonlinearity for a torque sensor shaft produced by the method of the present invention. The shaft material used was SNCM 815 steel specified in JIS. The shaft was subjected to shot peening first with steel particles of 0.6 mm in diameter at a shot pressure of 7 kgf/cm$^2$ and a coverage of not less than 70% and then with steel particles of 44 μm in diameter at a shot pressure of 5 kgf/cm$^2$ and a coverage of not less than 70%. The sensor characteristic was measured by constant voltage drive with an effective excitation current of 35.5 mA while changing the frequency. In the figure, the lower group of curves show the hysteresis and nonlinearity measured. The upper group of curves are for a comparative example, showing the result obtained by a measurement under the same conditions for the same shaft material when shot peening was effected only with steel particles of 0.6 mm in diameter at a shot pressure of 7 kgf/cm$^2$ and a coverage of not less than 70%.

As is clear from the figure, according to the method of the present invention, as compared with the case of using only one kind of particles, not only hysteresis but also nonlinearity is improved.

As for the magnitude of the compressive residual stress in the outermost surface layer due to shot peening, in the case of shot peening with steel shots of 0.6 mm in diameter, as shown in FIG. 1, a compressive residual stress of about 50 kgf/mm$^2$ appears both axially and circumferentially, while application of shot peening first with shots of 0.6 mm in diameter and then with shots of 44 μm in diameter results in a compressive residual stress of about 70 kgf/mm$^2$ appearing both axially and circumferentially, achieving improvements in hysteresis, nonlinearity and sensitivity.

Experiments of shot peening were conducted by changing shot peening conditions. As a result, it was found that if the compressive residual stress in the outermost surface layer was not less than about 20 kgf/mm$^2$ and a region where the compressive residual stress was not less than about 20 kgf/mm$^2$, extends from the outermost surface layer to an area not less than 0.1 mm deep, this was very effective for improving hysteresis, nonlinearity and sensitivity.

What should be noted here is that while U.S. Pat. No. 4,933,580 discloses that shot peening is useful for greatly decreasing hysteresis and increasing sensitivity, the present invention has proved that shot peening is also useful for improving nonlinearity. In other words, special mention should be made of the fact that shot peening greatly improves all of the fundamental performance characteristics required of a sensor, i.e., hysteresis, nonlinearity and sensitivity; thus, the utility value of shot peening is very high.

Further, as is clear from FIG. 2, according to the present invention, as compared with the case of effecting shot peening with steel particles of 0.6 mm in diameter alone, both hysteresis and nonlinearlity are improved over the entire range of excitation frequency used in measurement. The reason is that shot peening first with steel particles of 0.6 mm in diameter and then with steel particles of 44 μm in diameter ensures that the residual stress distribution in the vicinity of the outermost surface layer where a maximum stress occurs when stress is measured by a torque sensor is a uniform distribution in which when excitation is effected using a wide excitation frequency range from 10 kHz to 100 kHz, the residual stress is at a maximum and uniform over the entire skin depth range through which the magnetic flux passes.

The reason why nonlinearity is improved as described above is that the magnetic anisotropy of grooves is heightened by shot peening.

According to a recent study of the present inventors, application of shot peening to the grooved portions which are magnetically anisotropic portions results in generation of residual stress in the magnetically anisotropic portions. As may be understood from the knurling configuration shown in FIG. 3, in the case where the dimension in the direction of the grooves is longer than that in a direction orthogonal thereto (i.e., in the direction of the width), in other words, in the case where elongate grooves are formed, compressive residual stress due to shot peening may be expressed by the following relation: (compressive residual stress in the direction of the grooves)<(compressive residual stress in a direction orthogonal to the direction of the grooves) (see Symposium Material entitled "Residual Stresses and Shot Peening", Jan. 28, 1990, p. 19, Isuke Iida, Professor at Meiji University). Thus, the direction becomes the easy direction of magnetization. Primarily, the grooves which are of an elongate configuration have a geometrical magnetic anisotropy with an easy-to-magnetize axis. Yet, a further magnetic anisotropy due to residual stress is provided by shot peening, and this results in improved nonlinearity and further hysteresis reduction.

Further, according to the present invention, since shot peening is effected first with shot particles of large diameter and then with shot particles of small diameter, microcracks often produced by shot particles of large diameter are mended by shot particles of small diameter. As a result, the surface quality of the torque sensor shaft is improved and the strength of the shaft is increased; this fact also contributes to improvement in hysteresis and nonlinearity characteristics.

Nextly, the relationship between shot-particle size and groove bottom radius will be explained. In the knurled groove portion shown in FIG. 3, the groove bottom is subject to large stress concentration and, therefore, should preferably have a radius of not less than 0.2 mm. Further, in order to provide improved mechanical strength and improved magnetic characteristic through shot peening, it is necessary that shot particles should uniformly impinge upon the entirety of the knurled portion, and the coverage should preferably be not less than 98%. Generally, in the art of shot peening, a 98%, coverage is called "full coverage".

Figure 3:
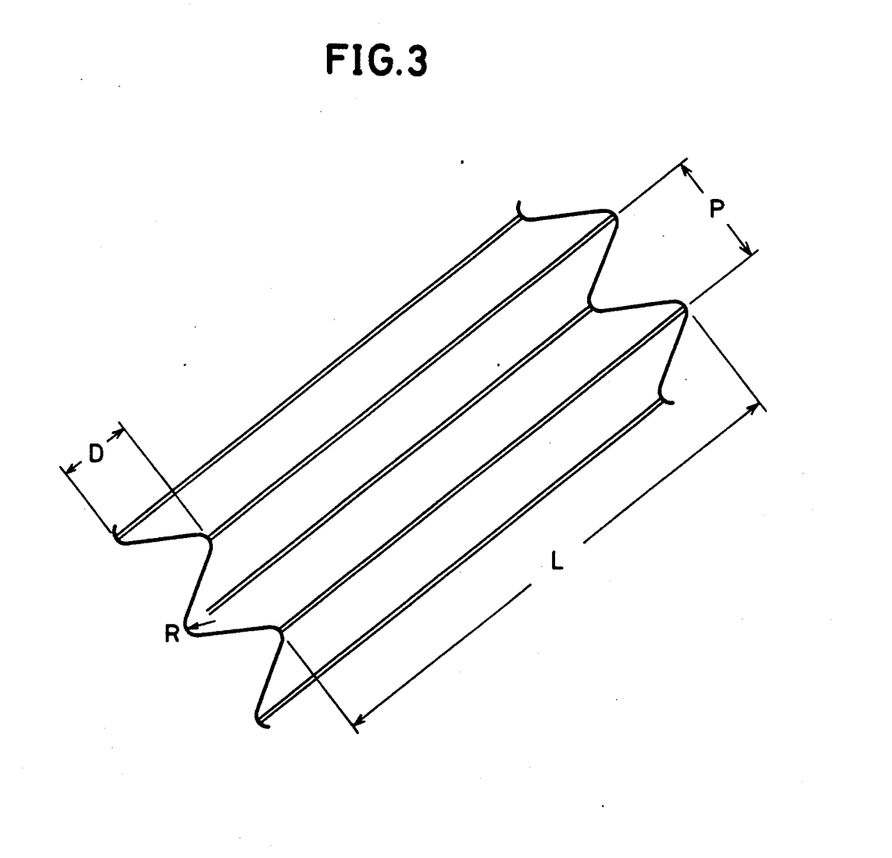
FIG. 3 is a view showing a knurled portion of a torque sensor of knurled type.
Figure 4:
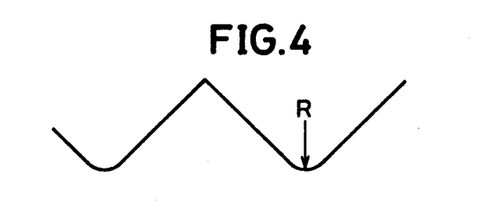
FIGS. 4 to 9 are sectional views showing modified forms of the knurled portion.
Figure 5:
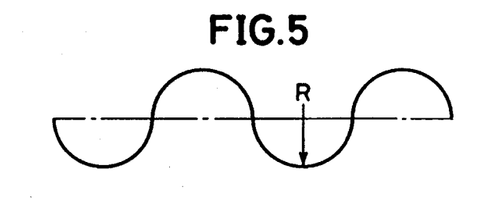
Figure 6:
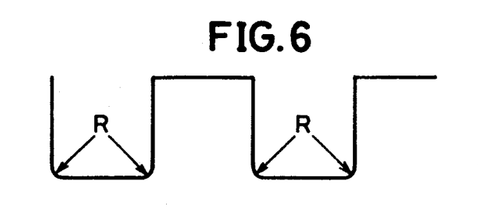
Figure 7:
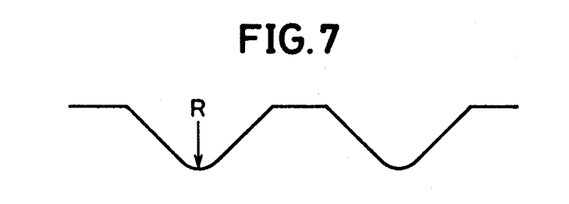
Figure 8:
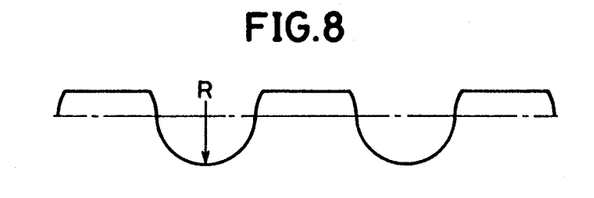
Figure 9:
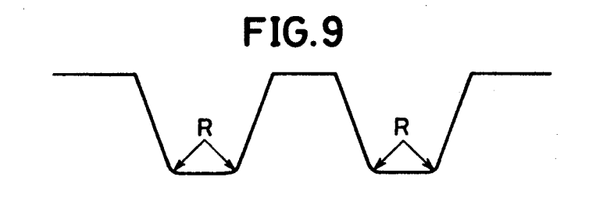

The knurled portion shown in FIG. 3 has a groove pitch P of 2 mm, a groove length L of 15 mm, a groove bottom radius R of 0.4 mm, and a groove height D of 1 mm. The knurled portion was subjected to shot peening with two kinds of shot particles different in particle diameter. First shot particles had a nominal particle diameter of 0.6 mm (SAE S170) (JIS S-S160), a median particle diameter of 0.6 mm, and a hardness of Hv=700. Second shot particles had a nominal particle diameter of 44 μm, a median distribution of 44 μm, a distribution of not more than 90 μm, and a hardness of Hv=700. Shot peening conditions were: arc height after first shot, 0.30 mmA; arc height after second shot, 0.33 mmA; coverage after first shot, 200%; and coverage after second shot, 600%.

In this way, in order to achieve good shot peening effect, it is important that the nominal particle diameter for second and subsequent, if any, shots in particular be smaller than two times the radius R of the rounded groove bottom. In other words, it is essential that the following relation should hold:

$$\phi s(mm) < 2R(mm)$$

This relation should hold constant even when the sectional configuration of grooves of the knurled portion varies in different ways as shown in FIGS. 4 to 9. This relation may hold true with respect to particle diameters of not only second and subsequent shots but also of first shot.

Figure 10:
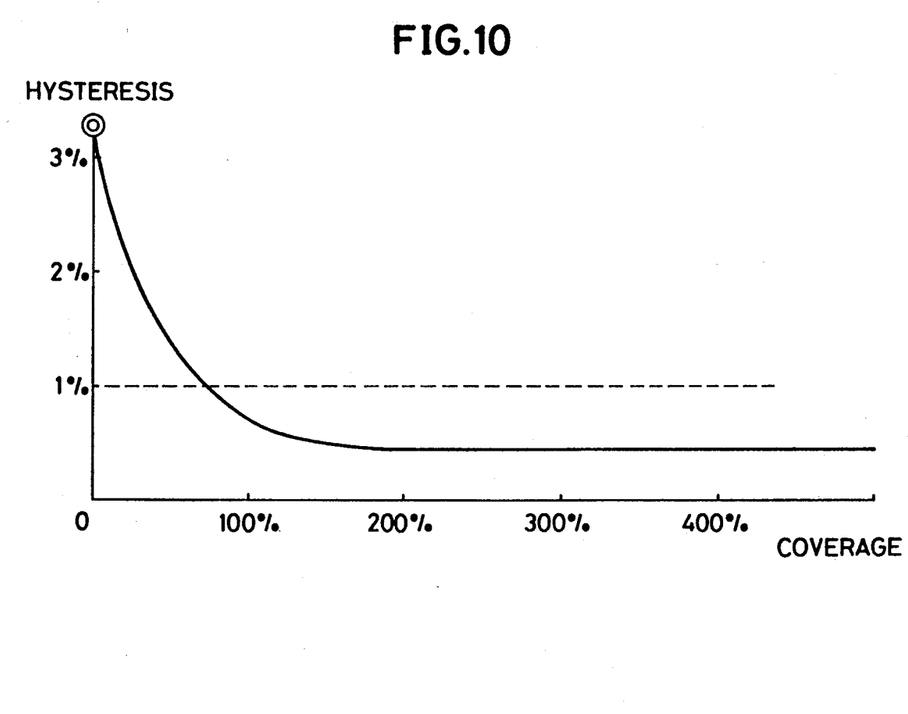
FIG. 10 is a diagram showing the relationship between shot peening coverage and sensor hysteresis.

FIG. 10 shows the results of a study on the relationship between coverage and hysteresis. Improvement in sensor characteristics can be obtained when the coverage is 70% and above, but preferably the coverage should be 98% and above.

Nextly, mention is made of heat treatments. In order to obtain improved fatigue strength of sensor shafts, it is effective to subject the sensor shaft first to heat treatments in general practice, such as hardening by carburization, induction hardening, carbontriding, and nitride heat treatment, and subsequently to subject it to shot peening first with shots of large diameter particles and then with shots of small diameter particles.

Finally, the relationship between the hardness of a shaft material heat treated but prior to shot peening and the hardness of shot particles will be explained. In order that shot peening may result in satisfactory compression hardening and good improvement in magnetic characteristics of the surface layer of the magnetically anisotropic section of the sensor shaft, it is desirable that the hardness Hvs of shot particles be greater than the surface hardness Hvk of the magnetically anisotropic section. In other words, it is desirable that the following relation should hold:

$$Hvs > Hvk$$

The foregoing example refers to the case of using two groups of shot particles having large and small diameters respectively. However, three or more groups of shot particles differing in diameter may be used so long as a plurality of shot peening operations are effected using shot particles with successively decreasing diameters. If, however, the order is reversed to use shot particles of small diameter first and then shot particles of larger diameter, the effects brought about by shot particles of small diameter are killed by shot particles of larger diameter, so that the intended frequency characteristics cannot be attained. Similarly, if a mixture of shot particles of large and small diameters is used for a single shot peening operation, neither hysteresis nor nonlinearity is improved.

What is claimed is:

1. A method of improving the magnetic performance characteristics of a magnetostriction type torque sensor in respect of hysteresis, sensitivity and non-linearity, said torque sensor having a torque sensor shaft, comprising:
    forming on the surface of said torque sensor shaft a magnetostrictive portion comprised of a plurality of knurled grooves each having a radius at its bottom;
    applying to the surface of said torque sensor shaft including at least said magnetostrictive portion a plurality of shot peening operations successively using shot particles of different, decreasing diameters; and,
    using for the second and any subsequent one of said shot peening operations shot particles having a diameter smaller than two times said radius of said knurled grooves.

2. The method set forth in claim 1, using two groups of shot particles of different diameters.

3. The method set forth in claim 1, using three or more groups of shot particles of different diameters.

4. The method set forth in claim 1 wherein the material of said torque sensor shaft has a skin depth region in the outermost layer thereof, and
    applying said shot peening operations so as to provide in said skin depth region a compressive residual stress of not less than 20 kgf/mm$^2$ within a range of not less than 0.1 mm depthwise from the surface of said torque sensor shaft.

5. The method set forth in claim 1, further comprising subjecting said torque sensor shaft to heat treatment subsequent to said forming operation and prior to the application of said shot peening operations, and using in said shot peening operations shot particles having a hardness greater than the hardness of said magnetostrictive portion after said heat treatment operation and prior to said shot peening operations.

6. The method set forth in claim 1 wherein said shot peening operations are carried out so as to obtain a coverage of 98%.

* * * * *